United States Patent [19]

Moreau

[11] 4,330,756

[45] May 18, 1982

[54] AUDIO-FREQUENCY AMPLIFYING DEVICE

[75] Inventor: Jean M. Moreau, Paris, France

[73] Assignee: Thomson-CSF, Paris, France

[21] Appl. No.: 162,740

[22] Filed: Jun. 25, 1980

[30] Foreign Application Priority Data

Jun. 27, 1979 [FR] France ............................ 79 16558

[51] Int. Cl.³ ............................................. H03F 3/20
[52] U.S. Cl. .................................... 330/297; 330/51;
330/124 R; 330/295
[58] Field of Search .................... 330/51, 124 R, 146,
330/295, 297

[56] References Cited

FOREIGN PATENT DOCUMENTS 264470 6/1970 U.S.S.R. ............................. 330/297

Primary Examiner—James B. Mullins
Assistant Examiner—Gene Wan
Attorney, Agent, or Firm—Cushman, Darby & Cushman

[57] ABSTRACT

The audio-frequency amplifying device comprises a first class B amplifier, a second class B amplifier, switching means controlled by a control sub-assembly and transmission means applying a signal to the input of the second amplifier. The load is connected to the first amplifier, and to the switching means connecting it either to the output of the second amplifier or to a zero potential middle point.

8 Claims, 5 Drawing Figures

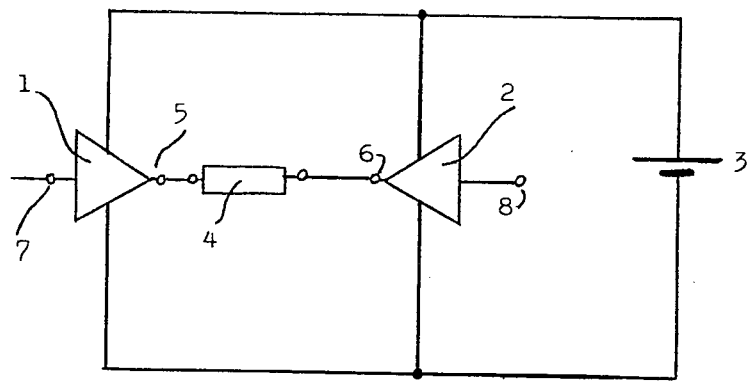
FIG_1
(PRIOR ART)
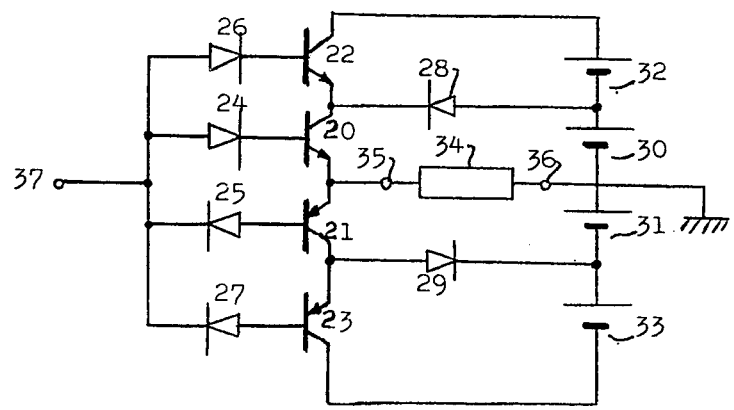
FIG_2
(PRIOR ART)

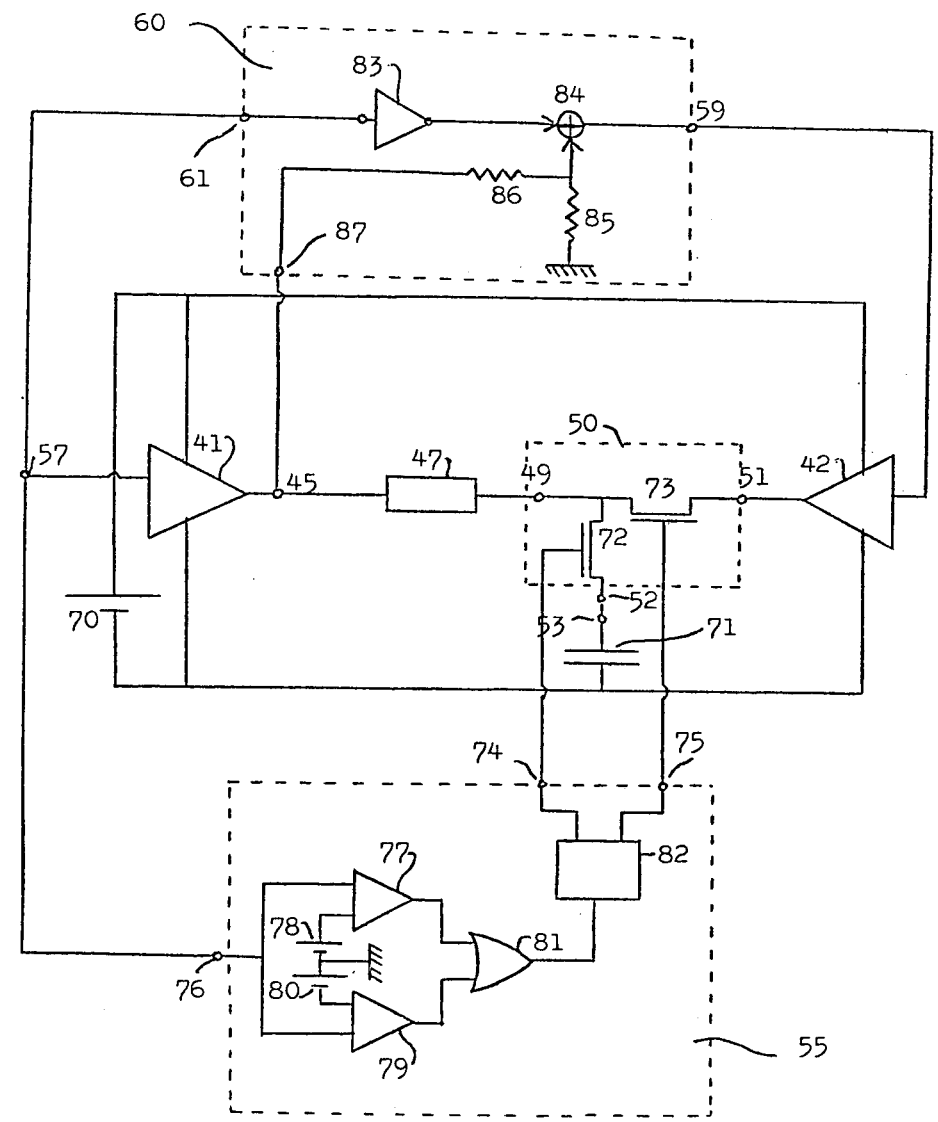
FIG_5

AUDIO-FREQUENCY AMPLIFYING DEVICE

BACKGROUND OF THE INVENTION

The present invention relates to an audio-frequency power amplifying device.

Audio-frequency power amplifying circuits usually allow high electric powers to be delivered across a load. One of the principal characteristics of such amplifiers is the efficiency, i.e. the ratio between the power effectively delivered across the load and the total power provided by the supply source which feeds them. A second important characteristic is the maximum voltage which they can supply across the load for a given supply voltage. Furthermore, it is manifestly advantageous from an economical point of view to have an amplifier requiring only a single supply voltage source.

A number of known devices have enabled amplifiers to be constructed having good characteristics insofar as one or the other of the abovementioned points is concerned. Among these known devices, the class B amplifier has a relatively high efficiency, close on 0.8 in the case of amplification of a sine-wave signal whose amplitude is close to the admissible maximum. This amplifier, well-known in the technique, has an output terminal able to deliver a bidirectional current and whose potential may vary between zero and the maximum voltage of the supply source. The load is generally connected, on the one hand, to the output terminal of the amplifier and, on the other hand, to an intermediate potential point, this potential being most frequently equidistant from the zero potential and from the maximum potential V of the supply source. The voltage at the terminals of the load may then vary between $-V/2$ and $+V/2$, and generally its average value is zero. Under these conditions, the intermediate potential point may be obtained by connecting a high-value capacitor between the zero potential point or the $+V$ potential point and the terminal of the load opposite the output terminal of the amplifier. For the parts of the signal higher than the average value, the supply source supplies to the load the required current from the output terminal of the amplifier, thus supplying a charge to the capacitor. For the parts of the signal less than the average value, the capacitor supplies to the load the required current, this current entering through the output terminal of the amplifier. This type of power amplifier has a good efficiency when the output signal has a value close to the maximum value. On the other hand, when such an amplifier is used to amplify signals of a lower value, its efficiency decreases rapidly, being for example in the neighborhood of 0.4 when the power is equal to a quarter of the maximum admissible output power.

Another known device, shown schematically in FIG. 1, consists in connecting together two class B amplifiers 1 and 2, supplied from the same supply source 3, the load 4 being connected between the output terminals 5 and 6 of the amplifiers. The input terminal 7 of amplifier 1 receives the signal to be amplified S, whereas the input terminal 8 of amplifier 2 receives the opposite of this signal $-S$. The efficiency of this arrangement is identical with that of a single class B amplifier, but enables further a voltage between $+V$ and $-V$ to be obtained across the load, V being the voltage of the single supply source 3.

Another known device is shown schematically in FIG. 2. This device, known under the name of class G amplifier, comprises two interconnected class B amplifiers supplied with different supply voltages. Transistors 20 and 21 form a first class B amplifier, supplied through diodes 28 and 29 from the middle-point supply source formed by voltage sources 30 and 31 connected in series. The load 34, connected between the output terminal 35 of this amplifier and the middle point 36 of the sources, is subjected to an output voltage which may vary between $+V$ and $-V$, V being the voltage at the terminals of voltage sources 30 or 31. Assuming that transistors 20 and/or 21 are saturated, transistors 22 and 23, connected in series with these latter as shown in the figure, form a second class B amplifier, supplied from the middle-point source formed by the voltage sources in series 30, 31, 32 and 33. Generally sources 32 and 33 are used having the same voltage V'. When this second amplifier is operating, the voltage at the terminals of load 34, still connected between the output terminal 35 of the amplifier and the middle point 36 of the sources, is subjected to a voltage capable of varying from $-(V+V')$ to $+(V+V')$. Diodes 24, 25, 26 and 27 connected to the bases of transistors 20, 21, 22 and 23 form a switching unit for controlling either the first amplifier or the second amplifier depending on the level of the input voltage applied to the input terminal 37. This arrangement permits, when the input signal at terminal 37 is low, solely the first class B amplifier formed by transistors 20 and 21 to be controlled. This amplifier, supplied from voltage sources 30 and 31, operates under better conditions than if it were supplied by the maximum voltage source formed by 30, 31, 32 and 33. Thus, its efficiency is higher than would be obtained by a single class B amplifier supplied with the maximum voltage. Similarly, when the input voltage at terminal 37 is high, with the output voltage at the terminal of load 34 exceeding the value V of sources 30 and 31, the second amplifier formed by transistors 22 and 23 is then controlled. It allows the signal portions corresponding to output voltages greater than V, and going up to $V+V'$, to be amplified. The second amplifier also operates then under good conditions, since its output voltage is close to the maximum admissible voltage. The class G amplifier thus described has a higher efficiency than that of a class B amplifier, or of two bridge-mounted amplifiers such as described in FIG. 1. Nevertheless, it does not allow a peak voltage higher than half the maximum supply voltage formed by the sum of the voltages of sources 30, 31, 32 and 33 to be supplied across the load and, furthermore, it requires the presence of several power supply sources.

SUMMARY OF THE INVENTION

The present invention has as objective the provision of audio-frequency power amplifiers whose efficiency is as good as that of class G amplifiers while reducing the number of power supply sources required.

Similarly, the present invention aims at providing amplifiers presenting the advantages of the prior art device described in FIG. 1, i.e. on the one hand, only requiring a single voltage V power supply source, supplying across the load a peak voltage equal to $+V$, and having the advantage of an efficiency as good as that of the class G amplifier of FIG. 2.

To attain these objectives and others, the present invention provides an audio-frequency amplifying device, comprising two amplifiers supplied respectively from two sources of voltage V1 and V2, each of the supply sources having two output terminals whose potentials are symmetrical with respect to a zero potential terminal, the output terminal of the first amplifier being connected to one of the two terminals of the load, the other terminal of the load being connected through two-state switching means either to the output terminal of the second amplifier or to the zero potential terminal, the device comprising further control means for causing the switching means to connect the terminal of the load either to the output terminal of the second amplifier or to the zero potential terminal, depending on the level of the signal to be amplified by the amplifying device, and means for applying to the second amplifier an input signal depending, on the one hand, on the signal to be amplified and, on the other hand, on the output voltage of the first amplifier.

According to another aspect of the present invention, the second amplifier is also supplied from supply source V1, supply source V2 being omitted. The whole thus comprises only a single power supply source.

According to another aspect of the present invention, the zero potential terminal is connected to a terminal of a high-value capacitor, the other terminal of this capacitor being connected to one of the terminals of the supply source.

According to another aspect of the present invention, the control device is such that it causes the load to be connected to the zero potential terminal when the input signal is less than the predetermined threshold corresponding to saturation of the first amplifier, and the load to be connected to the output terminal of the second amplifier when the input signal is greater than said threshold.

According to another aspect of the present invention, the switching means comprise at least one field-effect transistor, connected between the load and the zero potential terminal.

According to another aspect of the present invention, the means for applying an input signal to the second amplifier comprise an inverter whose input is connected to the input terminal of the amplifying device, and whose output terminal is connected to one of the two inputs of an adder device producing at its output terminal connected to the input of the second amplifier a signal equal to the sum of the signals applied to its two inputs. The second input of the adder device is connected to the output of the first amplifier through a resistance-divider bridge having a ratio (1/G), G being the gain of this first amplifier.

DESCRIPTION OF THE DRAWINGS

These objects, characteristics and advantages as well as others of the present invention will be discussed in more detail in the following description of particular embodiments, made with reference to the accompanying figures in which:

FIG. 1 is for illustrating a device of the prior art;
FIG. 2 shows another device of the prior art;
FIG. 5 shows in more detail the device of the embodiment shown in FIG. 4.

DESCRIPTION OF THE PREFERRED EMBODIMENTS

Figure 3:
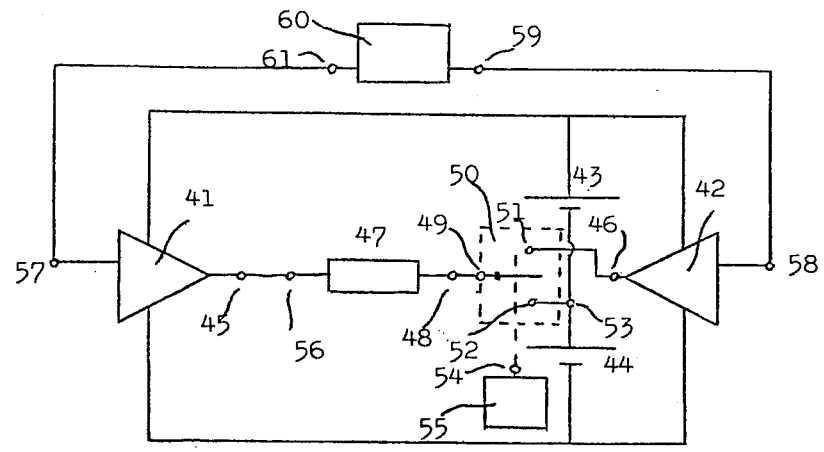
FIG. 3 shows schematically one particular embodiment of the device of the invention.

As is shown schematically in FIG. 3, the amplifying device of the present invention comprises two amplifiers 41 and 42 supplied from a supply source formed by voltage sources 43 and 44 having an equal voltage V and connected in series. Each of the two amplifiers 41 and 42 is capable of supplying at its output terminal, respectively 45 and 46, a potential capable of varying between the most negative potential and the most positive potential of supply source 43–44, and admitting an output current in both directions. The output terminal 45 of amplifier 41 is connected to a terminal 56 of load 47. The second terminal 48 of the load is connected to an output terminal 49 of a switching sub-assembly 50. This switching device comprises two other output terminals, terminal 51 which is connected to the output terminal 46 of amplifier 42, and terminal 52 which is connected to terminal 53, the common point of supply sources 43 and 44. Terminal 53 is called zero potential terminal. Switching sub-assembly 50 is controlled through a connection shown with a broken line 54 by means of a control sub-assembly 55. Switching sub-assembly 50 fulfils the role of inverter switch, able to be positioned particularly in the two following states: in state I terminal 49 is connected electrically to terminal 51, terminal 52 being isolated from terminals 49 and 51; in state II terminal 49 is connected to terminal 52, terminal 51 being isolated from terminals 49 and 52. The input terminal 57 of amplifier 41 receives the signal to be amplified. The input terminal 58 of amplifier 42 is connected to the output terminal 59 of a transmission sub-assembly 60 whose input terminal 61 is connected to the input terminal 57 of amplifier 41.

The operation of the device is the following:

When switching sub-assembly 50 is in position I, load 47 is subjected to the difference between the output voltages of amplifiers 41 and 42. This voltage at the terminals of the load may then assume any value between +2 V and −2 V. When one of the amplifiers is saturated, for example when amplifier 41 has its output terminal 45 at maximum potential, the voltage at the terminals of load 47 now only depends on the output voltage of amplifier 42. This voltage then depends on the input signal present at terminal 57 which is transmitted through the transmission element 60 to the input terminal of amplifier 42.

When the switching sub-assembly is in position II, the load is connected between the output of amplifier 41 and zero potential terminal 53. It should be noted that the supply source formed by the two voltage sources 43 and 44 in series has its two output terminals at symmetrical potentials with respect to zero potential terminal 53. In this position II of switching device 50, the voltage at the terminals of load 47 only depends on the output voltage of amplifier 41. This voltage may then assume any value between +V and −V. The amplifying device then behaves like a class B amplifier.

It is anticipated, in accordance with a characteristic of the present invention, that this device be used in the following way: when the input signal at terminal 57 has a low value, i.e. with a modulus less than a certain threshold corresponding to saturation of amplifier 41, control sub-assembly 55 forces switching device 50 into state II. Amplifier 41 then alone supplies the current required for load 47, amplifier 42 having no load current flowing therethrough and so dissipating negligible power. On the other hand, when the signal present at input terminal 57 is higher than the saturation threshold of amplifier 41, control sub-assembly 55 forces switching device 50 into state I, thus bringing into operation the second amplifier 42. During the whole time when the signal at the input remains higher than the saturation threshold, amplifier 41 remains saturated, its output terminal 45 being at a fixed potential close to the potential of one of the end terminals of the supply source. This amplifier 41 has flowing therethrough the current passing through the load but, because of its saturation state, the power which it dissipates is very small. The transmission unit 60 and amplifier 42, under the action of the input signal at terminal 57, supply across load 47 the complement of voltage corresponding to the part of the input signal which exceeds the saturation threshold of amplifier 41. For that, the transmission sub-assembly 60 supplies at its output terminal 59 a signal equal to the difference between, on the one hand, the input signal present at terminal 57 and, on the other hand, the input voltage which is sufficient to cause saturation of amplifier 41. This difference, applied with a suitable sign to the input of amplifier 42, causes to be obtained at the output terminal 46 of said amplifier the voltage complementary to the voltage already supplied by the output terminal 45 of amplifier 41 in the saturation state. When a variable signal is applied to input 57, control subassembly 55 reacts so as to cause switching of device 50 each time that the absolute value of the input signal exceeds or becomes lower than the saturation threshold voltage of amplifier 41.

The device thus used enables the following advantages to be obtained: on the one hand, the maximum possible voltage across load 47 is equal to 2 V; on the other hand, in the two modes of use, i.e. when amplifier 41 operates alone or when the two amplifiers 41 and 42 operate together, the power dissipated at these amplifiers is equal to the power which a class B amplifier would dissipate whose supply voltage is equal to 2 V when the input signal is low, and is equal to 4 V when the input signal is high. That leads to using these class B amplifiers in conditions which are more favorable to them from the efficiency point of view, i.e. under conditions where the output voltage is closest to the maximum admissible voltage. Similarly, it may be considered that this device enables an audio-frequency amplifier to be constructed having the same efficiency characteristics as a class G amplifier with four supply sources such as described in FIG. 2.

FIG. 4 shows again the principal elements of the device appearing in FIG. 3, and shows a particular embodiment of an amplifying device in accordance with the invention. As is shown in this figure, in this embodiment the device comprises only a single supply source 70 feeding the two amplifiers 41 and 42. In this case, zero potential terminal 53 is connected to one of the output terminals of supply source 70 through a high-value capacitor 71. There is shown in the figure a connection from this capacitor to the negative terminal of the supply source. This embodiment is satisfactory for applications where the voltage at the terminals of the load must have a zero average value. In fact, during the positive half-waves the capacitor is charged in a certain direction, and during the negative half-waves the capacitor discharges by the same amount in the other direction, the value of its voltage having practically not the time to vary. Thus an amplifying device in accordance with the invention has been constructed comprising only a single supply source instead of two sources for the preceding embodiment, and four sources for the known constructions such as shown in FIG. 2.

Figure 4:
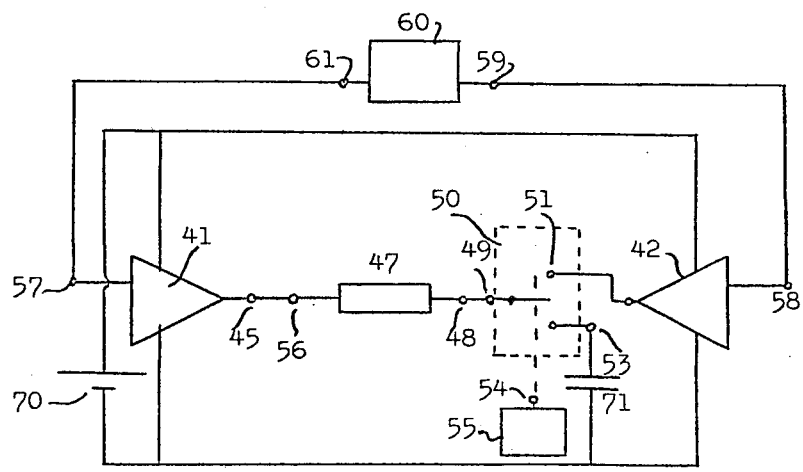
FIG. 4 shows another embodiment of the device of the invention.

FIG. 5 shows again the principal elements appearing in FIG. 4 with the same electrical connection arrangement and provides a more detailed representation of the control 55 and transmission 60 sub-assemblies. Amplifier 41 is connected by its output 45 to load 47, another terminal of the load being connected to terminal 49 of switching device 50, the output of amplifier 42 being connected to another terminal 51 of this same switching device 50. The zero potential terminal 53 is connected to another output terminal 52 of device 50. According to this embodiment, this device 50 comprises two MOS-type field-effect transistors 72 and 73 connected in the following way: transistor 72 has its drain connected to output terminal 52, its source connected to output terminal 49 of switching device 50, and its grid connected to an output terminal 74 of control sub-assembly 55. Transistor 73 has its source connected to output terminal 51, its drain connected to the output terminal 49 of the switching device, and its grid connected to an output terminal 75 of control subassembly 55. These two grid connections ending at terminals 74 and 75 of the control device are one embodiment of the connection, represented by the broken line 54 in FIG. 3, between switching device 50 and control subassembly 55.

Control sub-assembly 55, in this embodiment, comprises an input terminal 76 connected to the input terminal 57 of the amplifying device. A comparator 77 has a first input terminal connected to the input terminal 76, a second input terminal connected to the positive terminal of a voltage source 78 whose negative terminal is connected to ground, and an output terminal connected to a first input terminal of a logic OR gate 81. A second comparator 79 has an input terminal connected to input terminal 76, another input terminal connected to the negative terminal of a voltage source 80 whose positive terminal is connected to a zero potential point, and an output terminal connected to the other input terminal of logic gate 81. The output terminal of logic OR gate 81 is connected to the input terminal of an amplifying device 82. This device 82 has two output terminals connected respectively to the output terminal 74 and to the terminal 75 of control sub-assembly 55. Device 82 is constructed in any way wellknown in the technique for controlling two MOS-type field-effect transistors from an input voltage supplied by logic gate 81. Voltage sources 78 and 80 are equal in value, this value corresponding to the saturation threshold of an amplifier 41, i.e. to the voltage which, applied to terminal 57, causes saturation of this amplifier.

These voltage sources 78 and 80 are low-power reference sources, constructed in practice in any way wellknown in the technique, for example by tapping the terminals of the principal supply source 70 by means of resistance bridges. To simplify the description and the figures, they have been shown as independent voltage sources.

Transmission sub-assembly 60, comprising an input terminal 61 connected to the input terminal 57 of the device, and an output terminal 59 connected to the input terminal of amplifier 42, is constructed in accordance with this embodiment in the following way. An inverter 83 has its input terminal connected to terminal 61, and its output terminal connected to a first input of an adder 84, the output of which is connected to terminal 59 and the second input of which is connected to ground through a resistor 85. A resistor 86 is connected between the second input of adder 84 and and input terminal 87 of transmission sub-assembly 60. Input terminal 87 is connected to the output terminal 45 of amplifier 41. Resistance bridge 85-86 is a voltage divider.

The value of resistors 85 and 86 is chosen so that the output voltage of amplifier 41 is divided, so as to be applied to the input of adder 84, by a factor G, G being the gain of amplifier 41.

The operation of the device is the following:

Let us suppose in a first stage that the signal applied to the input terminal 57 of the amplifying device is small, i.e. less than the threshold causing saturation of amplifier 41. The signal, applied to the two inputs of comparators 77 and 79, is such that the output of these two comparators is at the zero logic level. The output of OR gate 81 is then also at the zero logic level. Amplifying device 82 then supplies at its output terminals 74 and 75 control voltages such that the field-effect transistor 72 is enabled and field-effect transistor 73 is disabled. Thus, load 47 is connected between zero potential terminal 53 and the output terminal of amplifier 41. This amplifier supplies the current required for the load and amplifies the voltage of the input signal present at terminal 57. Amplifier 42, whose output is in series with the disabled field-effect transistor 73, delivers no current.

When the signal, starting from a low positive value, increases, it reaches the saturation threshol of amplifier 41. At that moment, comparator 77 changes state, its output going to logic level 1, which causes a logic level 1 to appear at the output of gate 81. Device 82 then produces at its output terminals 74 and 75 voltages such that MOS transistor 72 is disabled, and transistor 73 is enabled. Under these conditions, load 47 is connected between the output terminal of amplifier 41 in the saturation state, and the output terminal of amplifier 42. The voltage divider formed by resistors 85 and 86 then supplies at the input terminal of adder 84 a voltage equal to the saturation threshold voltage of amplifier 41 with a suitable sign. This voltage, added to the opposite of the input signal of terminal 57, produced by inverter 83, supplies at terminal 59 a voltage whose modulus is equal to the part of the input signal which is not amplified by amplifier 41 in the saturation state, and having the opposite sign. Amplifier 42 thus supplies at its output terminal a voltage complementary to the voltage supplied by amplifier 41, this on condition that it has the same gain G.

In the case where the input signal becomes negative and higher in absolute value than the saturation threshold of amplifier 41, the output of comparator 77 remains in logic state 0, but the output of comparator 79 goes to logic level 1, which causes a logic level 1 to appear at the output of gate 81, causing, as previously, transistor 72 to be disabled and transistor 73 to be enabled. The operation is then the same as in the case of a positive signal higher than the saturation threshold.

This embodiment, described with reference to FIG. 5, is open to variations. For example, if amplifier 42 presents a high output impedance when it is not controlled, it is then possible to omit MOS field-effect transistor 73. For that, it is sufficient to provide in series with the input of this amplifier 42 a switch device for disconnecting this input when amplifier 42 is not to be used, i.e. when the input signal at terminal 57 is low. In particular, a field-effect transistor such as 73 may be placed not at the output of amplifier 42 but in series with its input. Transistor 73 could then be a low-power field-effect transistor.

Another variation of this embodiment consists in connecting the input terminal 76 of control sub-assembly 59 not to the input terminal 57 but to the output terminal 45 of amplifier 41. Therefore, to obtain the same operation, it is sufficient to provide voltage sources 78 and 80 whose value is close to the voltage which output 45 of amplifier 41 presents when it is saturated.

It has been assumed in what has gone before that the two amplifiers 41 and 42 have the same gain G and are supplied with an identical supply voltage. Therefore, if S is the maximum value of the input signal present at terminal 57, the switching of amplifier 42 takes place at the moment when the input signal reaches half its maximum value, i.e. S/2. It is possible to provide a device in which the switching takes place for a different value of this input signal. For that, a device may be provided having two supply sources, a first source such as 70 supplying amplifier 41, with a voltage equal to 2 V, and a second supply source of voltage 2 V' supplying amplifier 42. The first source 70 has, as in the preceding embodiments, potentials at its output terminals which are symmetrical with respect to the potential of the zero potential terminal 53. Similarly, the second source of potential 2 V' must have its two output terminals at symmetric potentials with respect to the same zero potential terminal. This may be achieved by any means well-known in the technique. The voltage across load 47 will then be between $+(V+V')$ and $-(V+V')$. In the case where for example V' is equal to twice V, switching of amplifier 42 will take place when the input signal at terminal 57 is equal to a third of its admissible maximum value. Such an arrangement may be advantageous if the input signal to be amplified is almost always less than a third of its maximum value.

The present invention is not limited to the embodiments which have been explicitly described but includes different variations and modifications thereof accessible to a man skilled in the art.

What is claimed is:

1. An audio-frequency amplifying device, comprising a first and a second amplifier, the first amplifier being supplied from a source supplying a voltage V1 whose two output terminals are at symmetrical potentials with respect to a zero potential terminal, said amplifying device delivering across a load comprising first and second terminals, the first terminal being connected to the output terminal of the first amplifier, wherein the second amplifier is supplied from a source of supply voltage V2 whose terminals are at symmetrical potentials with respect to the zero potential terminal, and wherein furthermore two-state switching means are provided connecting, in the first state, the second terminal of the load to the output terminal of the second amplifier and, in the second state, the second terminal of the load to the zero potential terminal, control means for forcing the switching means into one or the other of their states depending on the level of the signal to be amplified by the amplifying device, and transmission means for applying to the second amplifier an input signal depending on the signal to be amplified and on the output voltage of the first amplifier.

2. The device as claimed in claim 1, wherein the second amplifier is supplied from the same V1 voltage source as the first amplifier.

3. The device as claimed in claim 1, wherein the zero, potential terminal is connected to the connection point of two equal voltage sources connected in series to form the source supplying voltage V1.

4. The device as claimed in claim 1, wherein the zero, potential terminal is connected by means of a capacitor to a terminal of the supply source.

5. The device as claimed in claim 1, wherein the control means comprise a first comparator comparing the input signal to be amplified and a first positive voltage corresponding to the saturation threshold voltage of the first amplifier, a second comparator comparing the same input signal and the opposite of this saturation threshold voltage, the outputs of the two comparators being connected to a logic OR gate controlling the switching means through amplification means so that the second terminal of the load is connected to the zero potential terminal when the input signal does not saturate the amplifier and so that it is connected to the output terminal of the second amplifier when the input signal saturates the first amplifier.

6. The device as claimed in claim 1, wherein the transmission means comprise an inverter supplying the opposite of the signal to be amplified, a divider supplying a fraction of the output voltage of the first amplifier, and an adder whose input terminals are connected to the output terminals of the inverter and of the divider, supplying to the input of the second amplifier a voltage equal to and of opposite sign to the portion of the input signal which is not amplified by the first amplifier.

7. The device as claimed in claim 1, wherein the switching means comprise at least one field-effect transistor whose drain or source is connected to the second terminal of the load, whose source or drain is connected to the zero potential terminal, and whose grid is controlled by the control means so that the transistor is saturated when the signal to be amplified is small.

8. A process for amplifying an electric signal by means of two amplifiers supplied from supply sources whose output terminals have symmetrical potentials with respect to a zero potential terminal, the first amplifier being connected to one of the terminals of the load, comprising connecting a second terminal of the load to the zero potential terminal when the first amplifier is not saturated, and connecting this second terminal of the load to the output of the second amplifier when the signal to be amplified saturates the first amplifier, the second amplifier amplifying the part of the signal which is not amplified by the first amplifier in a saturation state.

* * * * *